(12) United States Patent
Mo et al.

(10) Patent No.: US 7,142,045 B2
(45) Date of Patent: Nov. 28, 2006

(54) CIRCUIT FOR GENERATING INTERNAL VOLTAGE

(75) Inventors: Hyun-Sun Mo, Seoul (KR); Sang-Ki Hwang, Sungnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 73 days.

(21) Appl. No.: 10/881,937

(22) Filed: Jun. 30, 2004

(65) Prior Publication Data

US 2005/0017704 A1   Jan. 27, 2005

(30) Foreign Application Priority Data

Jul. 22, 2003   (KR) .................... 10-2003-0050284

(51) Int. Cl.
*G05F 3/02* (2006.01)

(52) U.S. Cl. .................... 327/541; 327/535; 323/280

(58) Field of Classification Search ............... 327/407, 327/333, 315, 535, 538, 544, 539–543; 323/274–275, 323/280–281; 307/296.8
See application file for complete search history.

(56) References Cited

U.S. PATENT DOCUMENTS

| | | | | | |
|---|---|---|---|---|---|
| 5,554,953 | A | * | 9/1996 | Shibayama et al. | ......... 327/541 |
| 5,841,271 | A | * | 11/1998 | Nakayama | ................... 323/316 |
| 5,889,415 | A | * | 3/1999 | Parkinson | ..................... 326/68 |
| 6,384,672 | B1 | * | 5/2002 | Oh | ............................. 327/541 |
| 6,809,576 | B1 | * | 10/2004 | Yamasaki | .................... 327/540 |
| 6,946,876 | B1 | * | 9/2005 | Isezaki et al. | ................ 326/80 |

* cited by examiner

Primary Examiner—Rajnikant B. Patel
(74) Attorney, Agent, or Firm—F.Chau & Associates,LLC

(57) ABSTRACT

There is provided an internal voltage generating circuit that reliably supplies a constant internal voltage to the interior of a semiconductor device without regard to an external voltage, where the internal voltage generating circuit compares a first reference voltage with a first internal voltage fed back to generate the first internal voltage following the first reference voltage, receives the first internal voltage to generate a second reference voltage which is more insensitive to fluctuation of the external voltage than the first reference voltage, and compares the second reference voltage with a second internal voltage fed back to generate the second internal voltage which follows the second reference voltage and has a variation gradient smaller than that of the first internal voltage when the external voltage is changed, thereby supplying the second internal voltage to a circuit requiring stabilized internal voltage, which is obtained to increase stability and durability of the operation of the semiconductor device.

12 Claims, 11 Drawing Sheets

CIRCUIT FOR GENERATING INTERNAL VOLTAGE

BACKGROUND OF THE INVENTION

1. Field of the Invention

The present invention relates to circuits of semiconductor devices, and more particularly, to an internal voltage generating circuit for supplying a stabilized power source to the semiconductor device.

2. Description of the Related Art

Generally, as miniaturization of semiconductor devices proceeds, an electrical field stress applied to a unit cell frequently exceeds a tolerance limit, thereby greatly affecting the device lifetime. That is, standard operating voltage conditions maintain the operating voltage substantially equal to that used in the past, depending on the circumstances of the entire system, even though the operating voltage conditions should be readjusted to comply with the miniaturization of the device. Thus, the reliability of the unit cells is degraded.

A conventional semiconductor memory device, for example, uses an internal voltage adapted to characteristics of the miniaturized products, where an internal voltage is typically lowered from an external voltage inputted from the outside. In the following background description, internal voltages of conventional semiconductor memory devices will be described with respect to FIGS. 1 through 3, including several problems and disadvantages thereof.

FIG. 1 is a schematic block diagram illustrating a conventional internal voltage generating circuit. Referring to FIG. 1, the conventional internal voltage generating circuit includes a reference voltage generator 10 and an internal voltage driver 20. The reference voltage generator 10 receives an external voltage Vcc to generate a reference voltage Vref, and the internal voltage driver 20 compares the reference voltage Vref with an internal voltage IVC fed back to output the internal voltage IVC following the reference voltage Vref.

FIG. 2 is a circuit illustrating the reference voltage generator and the internal voltage driver of FIG. 1. Referring to FIG. 2, resistors R1, R2 and N-type CMOS transistor NM1 are coupled in series between the external voltage Vcc and ground voltage Vss in the reference voltage generator 10. A gate of the N-type CMOS transistor NM1 is connected to a node NO1 between the resistors R1 and R2, the reference voltage Vref being generated form the node NO1. A P-type CMOS transistor PM1 is coupled between the node NO1 and the ground voltage Vss, in which a gate is connected to a drain node NO2 of the N-type CMOS transistor NM1.

Thus, as the external voltage Vcc is changed, the level of the reference voltage Vref is also changed, thereby generating the reference voltage Vref at a certain level even though the external voltage Vcc increases over a specific level. Further, the internal voltage driver 20 includes a comparator DA1 and a driving P-type CMOS transistor DPM1. The comparator DA1 includes a well-known differential amplifier, and compares the reference voltage Vref generated from the reference voltage generator 10 with the internal voltage IVC fed back from the output stage to output a comparison signal. Then, low level of the comparison signal is outputted if the reference voltage Vref is higher than the internal voltage IVC, otherwise high level of the comparison signal is outputted.

The driving P-type CMOS transistor DPM1 responds to the comparison signal and controls the external voltage Vcc to output the internal voltage IVC. The internal voltage driver 20 causes the internal voltage IVC to follow the reference voltage Vref by comparing the reference voltage Vref with the internal voltage IVC fed back, to decrease the output voltage if the internal voltage IVC is higher than the reference voltage Vref, but to otherwise increase the output voltage.

However, since the conventional internal voltage generating circuit generates the internal voltage IVC according to a level of the reference voltage Vref provided by the reference voltage generator 10, the level of the internal voltage IVC is not maintained constant when the external voltage Vcc is varied or when the extent of the operating power source is wide.

FIG. 3 is a graph illustrating an initial operating characteristic of the conventional internal voltage generating circuit of FIGS. 1 and 2, and indicated generally by the reference numeral 30. The internal voltage IVC has a characteristic that is increased according to the external voltage Vcc until an initial certain specific voltage, and at a setting voltage, tends to maintain a constant and stable voltage level independent of increment of the external voltage Vcc. In FIG. 3, the horizontal axis represents the external voltage while the longitudinal axis represents the internal voltage. The conventional internal voltage generating circuit, however, generates the internal voltage IVC having a certain variation gradient compared with an ideal internal voltage CVC that is uniform at a setting voltage. In addition, since the internal voltage driver 20 includes a transistor and a resistor, the internal voltage IVC generated from the conventional internal voltage generating circuit has a certain variation gradient that is substantially proportional to the external voltage Vcc.

Accordingly, the conventional internal voltage generating circuits suffer from the following problems and disadvantages: 1. When the external voltage is fluctuated, the reference voltage generated from the reference voltage generator is changed according to the external voltage, which also increases the variation gradient of the internal voltage that follows the reference voltage. Thus, the internal voltage acts as noise in the internal circuits of the semiconductor device requiring a stabilized power source, thereby causing a part of the circuit to be out of order and/or shortening the service life of the circuit.

SUMMARY OF THE INVENTION

Therefore, it is a feature of embodiments of the present invention to provide an internal voltage generating circuit that reduces the variation gradient caused by an external voltage fluctuation and generates a stable internal voltage, thereby increasing operational reliability of a semiconductor device.

As an aspect of this invention for solving the above problems, an internal voltage generating circuit adapted to a semiconductor device may include a first internal voltage driver for comparing a first reference voltage applied with a first internal voltage fed back to generate the first internal voltage following the first reference voltage, and a second internal voltage driver for receiving the first internal voltage to generate a second reference voltage, which is more insensitive to fluctuation of the external voltage than the first reference voltage, receiving the first internal voltage as a power source, and comparing the second reference voltage with a second internal voltage fed back to output the second internal voltage which follows the second reference voltage.

Further, as another aspect of this invention, an internal voltage generating circuit adapted to a semiconductor device may include a first reference voltage generator for generating a first reference voltage using an external voltage, a first internal voltage driving portion for comparing the first reference voltage with a first internal voltage fed back to generate the first internal voltage following the first reference voltage, a second reference voltage generator for receiving the first internal voltage to generate a second reference voltage which is more insensitive to fluctuation of the external voltage than the first reference voltage, and a second internal voltage driving portion for receiving the first internal voltage as a power source and comparing the second reference voltage with a second internal voltage fed back to output the second internal voltage which follows the second reference voltage.

As another aspect of this invention, an internal voltage generating circuit adapted to a semiconductor device may include a first internal voltage driver for comparing a first reference voltage applied with a first internal voltage fed back to generate the first internal voltage following the first reference voltage, and a second internal voltage driver for generating a second reference voltage using an external voltage, receiving the first internal voltage as a power source and comparing the second reference voltage with a second internal voltage fed back to output the second internal voltage which follows the second reference voltage.

As still another aspect of this invention, an internal voltage generating circuit adapted to a semiconductor device may include a first reference voltage generator for generating a first reference voltage using an external voltage, a first internal voltage driving portion for comparing the first reference voltage with a first internal voltage fed back to generate the first internal voltage following the first reference voltage, a second reference voltage generator for generating a second reference voltage using the external voltage, and a second internal voltage driving portion for receiving the first internal voltage as a power source and comparing the second reference voltage with a second internal voltage fed back to output the second internal voltage which follows the second reference voltage.

As yet another aspect of this invention, an internal voltage generating circuit adapted to a semiconductor device may include a first reference voltage generator for generating a first reference voltage using an external voltage, a first internal voltage driving portion for comparing the first reference voltage with a first internal voltage fed back to generate the first internal voltage following the first reference voltage, and a second internal voltage driving portion for receiving the first internal voltage to generate the second internal voltage.

DETAILED DESCRIPTION OF PREFERRED EMBODIMENTS

In the following description, the present invention will be described in terms of preferred embodiments of the internal voltage generating circuit with reference to FIGS. 4 through 14, which are intended to be only illustrative of the invention without any other intention.

Figure 1:
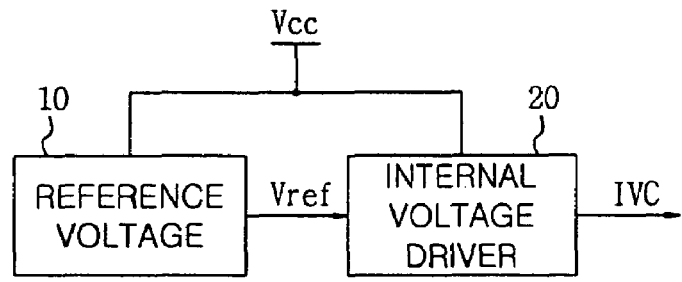
FIG. 1 is a schematic block diagram illustrating an internal voltage generating circuit as known in the prior art.
Figure 2:
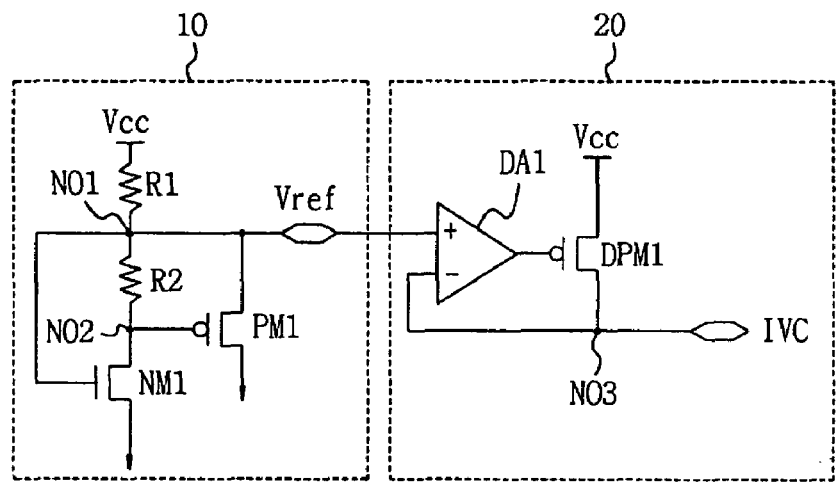
FIG. 2 is a circuit illustrating a reference voltage generator and an internal voltage driver of FIG. 1.
Figure 3:
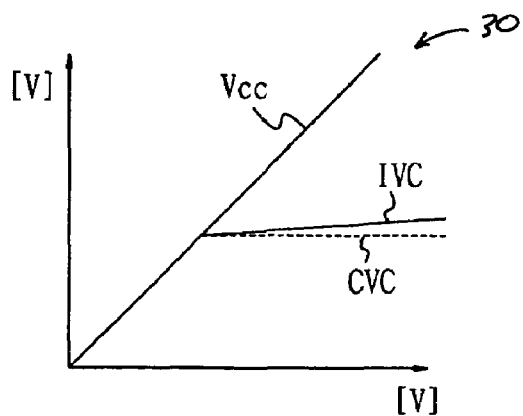
FIG. 3 is a graph illustrating an initial operating characteristic of the internal voltage generating circuit of FIGS. 1 and 2.
Figure 4:
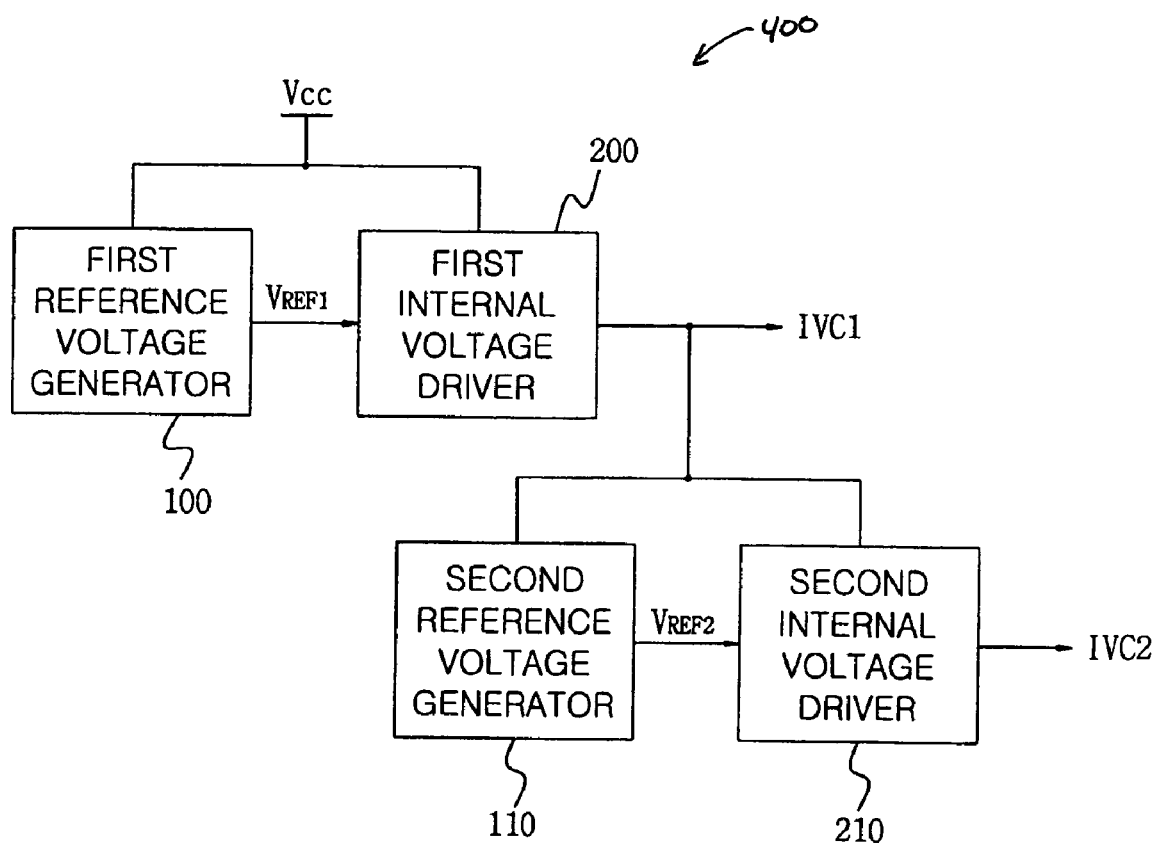
FIG. 4 is a schematic block diagram illustrating an internal voltage generating circuit according to a first embodiment of the present invention.

FIG. 4 is a schematic block diagram illustrating an internal voltage generating circuit according to a first embodiment of the present invention. Referring to FIG. 4, the internal voltage generating circuit according to the first embodiment of the present invention is indicated generally by the reference numeral 400, and comprises a first reference voltage generator 100 for generating a first reference voltage Vref1 using an external voltage Vcc, a first internal voltage driving portion 200 for receiving the external voltage Vcc as a power source to generate a first internal voltage IVC1 following the first reference voltage Vref1, a second reference voltage generator 110 for receiving the first internal voltage IVC1 to generate a second reference voltage Vref2, and a second internal voltage driving portion 210 for receiving the first internal voltage IVC1 as a power source to output a second internal voltage IVC2 which follows the second reference voltage Vref2. In the internal voltage generating circuit, since the second internal voltage IVC2 uses the first internal voltage IVC1 as the power source and follows the second reference voltage Vref2, it is output to be insensitive to noise caused by the external voltage Vcc. Therefore, the first internal voltage IVC1 and the second internal voltage IVC2 are supplied to various circuits (memory cell), sense amplifier, clock generating circuit and input circuit, etc., and the second internal voltage IVC2, preferably, is supplied to a circuit requiring relatively stabilized internal voltage.

Figure 5:
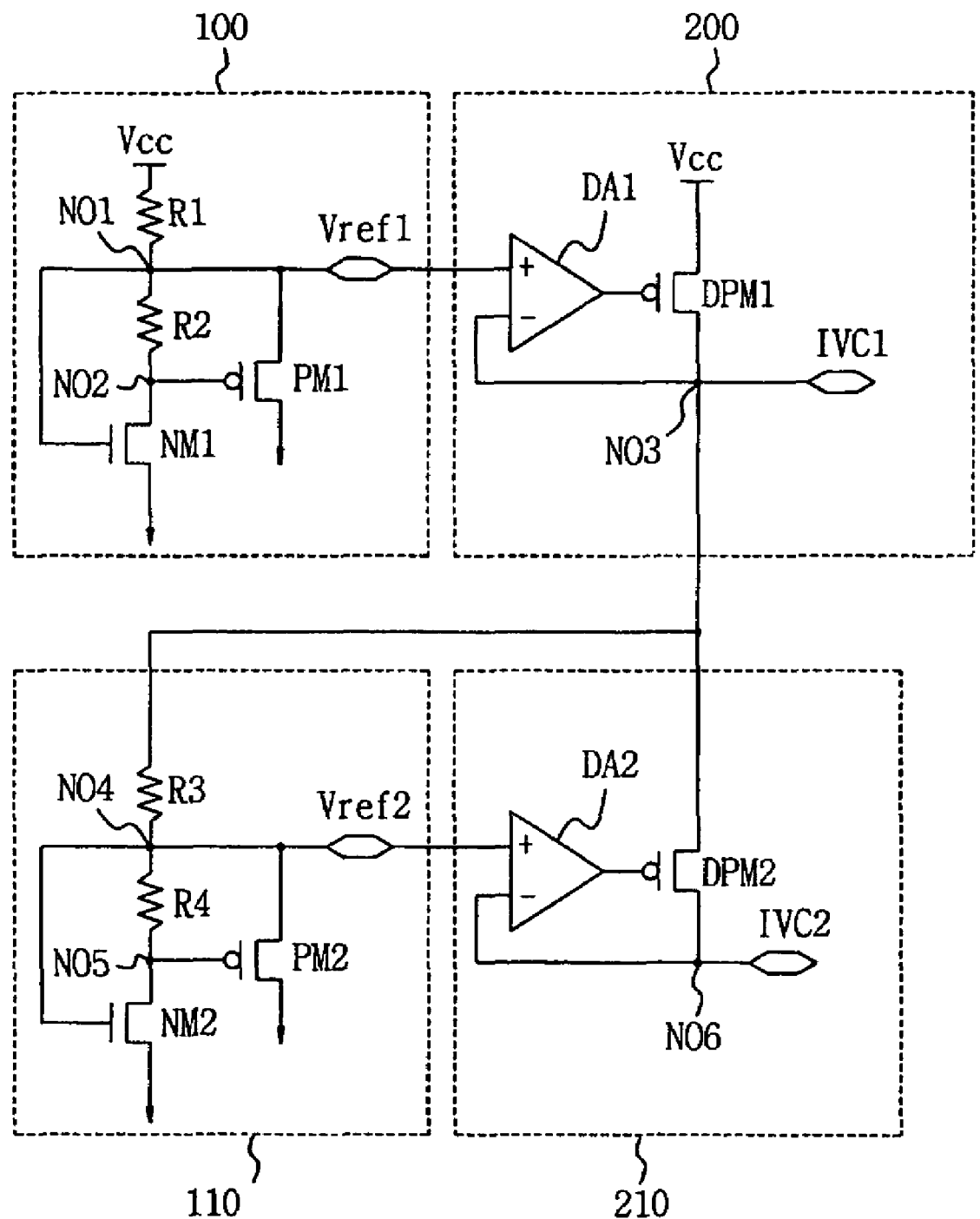
FIG. 5 is a detailed diagram illustrating the internal voltage generating circuit of FIG. 4.

FIG. 5 is a detailed diagram illustrating the internal voltage generating circuit of FIG. 4, indicated generally by the reference numeral 500. Referring to FIG. 5, the first reference voltage generator 100 comprises two resistors R1 and R2, an N-type CMOS transistor NM1, and a P-type CMOS transistor PM1. Then, the two resistors R1 and R2, and the N-type CMOS transistor NM1 are coupled in series between the external voltage Vcc and a ground voltage Vss, and the gate of the N-type CMOS transistor NM1 is connected to a node NO1 between the resistor R1 and the resistor R2. The first reference voltage Vref1 is, then, generated from the node NO1. A P-type CMOS transistor PM1 is coupled between the node NO1 and the ground voltage Vss, in which a gate is connected to a drain node NO2 of the N-type CMOS transistor NM1. Thus, as the external voltage Vcc is changed, the level of the reference voltage Vref1 is also changed. That is, electrical potential of the drain node NO2 is lowered because of current flow into the ground voltage Vss via the channel of the N-type CMOS transistor NM1 when the potential of the external voltage Vcc increases to the extent that it turns on the N-type CMOS transistor NM1. By this, the P-type CMOS transistor PM1 is turned on, and the potential of the first reference voltage Vref1 at the node NO1 is lowered until voltage pull-down path via the P-type CMOS transistor PM1 is cut off. On the contrary, in the case that the potential of the external voltage Vcc is low, the first reference voltage Vref1 is pulled up through the resistor R1, which potential increases because turn-on resistance of the N-type CMOS transistor NM1 increases. That is, the first reference voltage Vref1 is generated at the potential of low level if the external voltage Vcc is high, and the first reference voltage Vref1 is generated in the potential of high level if the external voltage Vcc is low. Then, the first reference voltage Vref1 having a certain average level is output through the node NO1.

Also, a first comparator DA1 of the first internal voltage driving portion 200 compares the first reference voltage Vref1 generated from the first reference voltage generator 100 with the first internal voltage IVC1 fed back from a node NO3, thereby outputting the comparison signal. Then, a comparison signal of low level is output when the first reference voltage Vref1 is higher than the first internal voltage IVC1, and a comparison signal of high level is output when the first reference voltage Vref1 is lower than the first internal voltage IVC1. A first driving P-type CMOS transistor DPM1 supplies or cuts off the external voltage Vcc responding to the comparison signal. Therefore, the first internal voltage driving portion 200 compares the first reference voltage Vref1 with the first internal voltage IVC1 fed back to lower the output voltage when the first internal voltage IVC1 is higher than the first reference voltage Vref1, and to increase the output voltage when the first internal voltage IVC1 is lower than the first reference voltage Vref1, thereby outputting the first internal voltage IVC1 following the first reference voltage Vref1. Then, in the case that the external voltage Vcc is changed, since the first internal voltage IVC1 is fluctuated slightly according to the changing of the external voltage, the first internal voltage IVC1 is output via the node NO3, and supplied to a second reference voltage generator 110 and a second internal voltage driving portion 210.

The second reference voltage generator 110 generates the second reference voltage Vref2 from a node NO4 coupled between a resistor R3 and a resistor R4, which are arranged in series with an N-type CMOS transistor NM2 between the node NO3 and the ground voltage Vss. The operation of the second reference voltage generator 110 is the same as that of the first reference voltage generator 100. Thus, its description is omitted. Since the second reference voltage Vref2 is insensitive to noise of the external voltage Vcc, its variation gradient or variation width is considerably reduced in comparison with that of the first reference voltage Vref1, thereby there being generated a stable voltage. The second reference voltage Vref2 is then supplied to the second internal voltage-driving portion 210 via the node NO4.

A second comparator DA2 of the second internal voltage driving portion 210 receives the second reference voltage Vref2 generated from the second reference voltage generator 110, compares the second reference voltage Vref2 with the second internal voltage IVC2, and outputs a resultant comparison signal. Then, a comparison signal of high level is output to a second driving P-type CMOS transistor DPM2 when the second internal voltage IVC2 is higher than the second reference voltage Vref2, and a comparison signal of low level is output to the second driving P-type CMOS transistor DPM2 when the second internal voltage IVC2 is lower than the second reference voltage Vref2. And then, since the second driving P-type CMOS transistor DPM2 supplies or cuts off the first internal voltage IVC1 responding to the comparison signal, the second internal voltage driving portion 210 compares the second reference voltage Vref2 with the second internal voltage IVC2 fed back thereby outputting the second internal voltage IVC2 following the second reference voltage Vref2. Generally, the second internal voltage IVC2 has a level less than that of the first internal voltage IVC1.

Therefore, the second internal voltage driving portion 210 receives the first internal voltage IVC1 as a power source, and produces the second internal voltage IVC2 which has a considerably reduced variation gradient or variation width in comparison with that of the first internal voltage IVC1. And the second internal voltage IVC2 has a constant and stable voltage level compared with the first internal voltage IVC1, which is affected by the fluctuation of the external voltage Vcc. Although the second internal voltage IVC2 may have a characteristic proportional to the first internal voltage IVC1, yet the second internal voltage IVC2 is very insensitive to noise of the external voltage in comparison with the first internal voltage IVC1.

Figure 6:
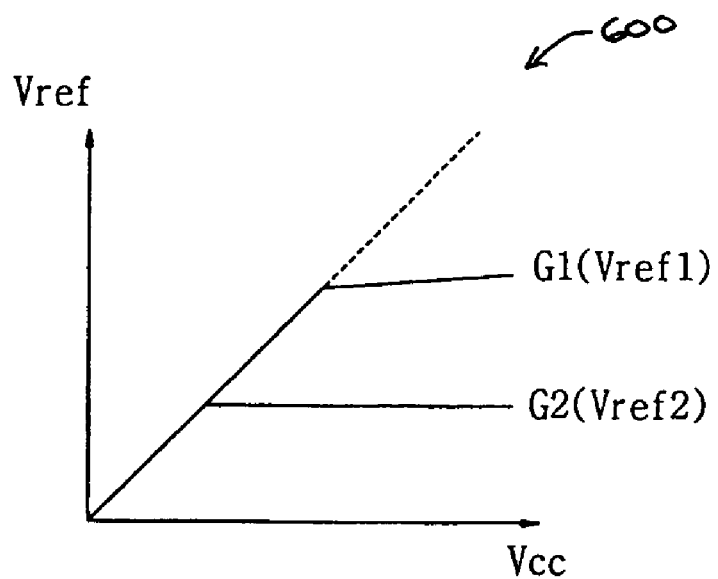
FIG. 6 is a graph comparing initial operating characteristics of first and second reference voltages according to the embodiment of FIGS. 4 and 5.

FIG. 6 is a graph, indicated generally by the reference numeral 600, comparing the initial operating characteristics of first and second reference voltages according to the first embodiment of the present invention. In FIG. 6, the horizontal axis represents the external voltage Vcc while the longitudinal axis represents the reference voltage Vref.

Referring to FIG. 6, in the case that the first reference voltage Vref1 has a level greater than that of the second reference voltage Vref2, when the external voltage Vcc is low, the first and second reference voltages Vref1 and Vref2 increase according to the external voltage Vcc. Then, the first reference voltage Vref1 converges into a certain voltage after the second reference voltage Vref2 converges into a setting voltage. Also, the graph G2 of the second reference voltage Vref2 represents a variation gradient less than that on the graph G1 of the first reference voltage Vref1.

Figure 7:
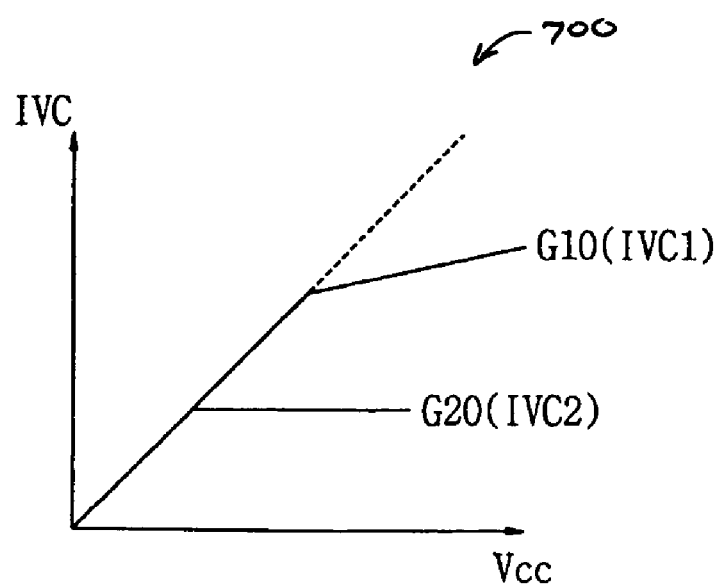
FIG. 7 is a graph comparing initial operating characteristics of first and second internal voltages according to the embodiment of FIGS. 4 and 5.

FIG. 7 is a graph, indicated generally by the reference numeral 700, comparing initial operating characteristics of first and second internal voltages according to the first embodiment of the present invention. In FIG. 7, the horizontal axis represents the external voltage while the longitudinal axis represents the internal voltage.

Referring to FIG. 7, in the case that the first internal voltage IVC1 has a level greater than that of the second internal voltage IVC2, when the external voltage Vcc is low, the first and second internal voltages IVC1 and IVC2 increase according to the external voltage Vcc. Then, the first internal voltage IVC1 converges into a certain voltage after the second internal voltage IVC2 converges into a setting voltage. Also, the graph G20 of the second internal voltage IVC2 represents a variation gradient or a variation width less than that of the graph G10 of the first internal voltage IVC1.

Therefore, the second internal voltage IVC2 has a very small variation gradient compared with that of the first internal voltage IVC1.

Figure 8:
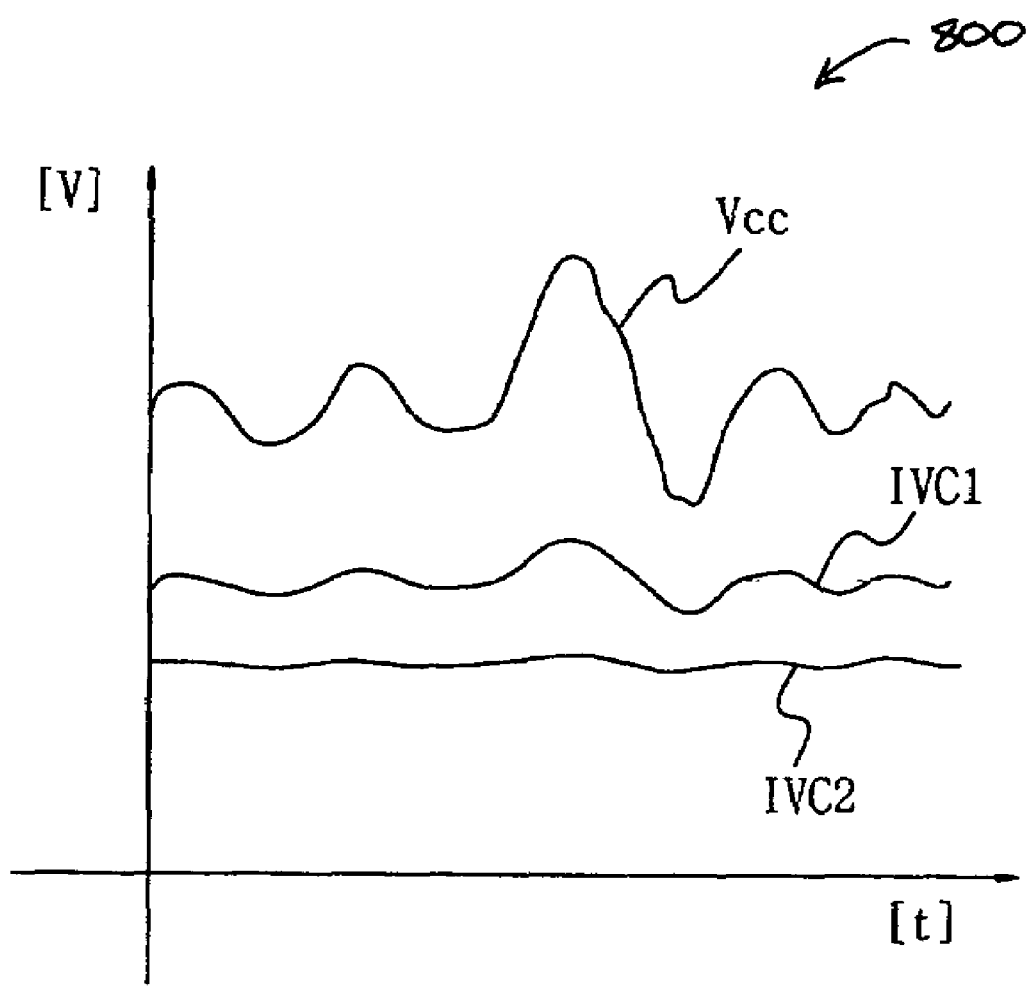
FIG. 8 is a graph illustrating an output voltage of the internal voltage generating circuit according to the embodiment of FIGS. 4 and 5.

FIG. 8 is a graph, indicated generally by the reference numeral 800, illustrating an output voltage of the internal voltage generating circuit according to the first embodiment of the present invention. In FIG. 8, the horizontal axis represents time while the longitudinal axis represents voltage.

Referring to FIG. 8, the first and second internal voltages IVC1 and IVC2 are output which have different levels from each other. If the external voltage Vcc is fluctuated, the first and second internal voltages IVC1 and IVC2 have relatively more stable waveform than that of the external voltage Vcc. Also, since the second internal voltage IVC2 has a fluctuation less than that of the first internal voltage IVC1, the second internal voltage IVC2 is output as a stable voltage, which is insensitive to noise of the external voltage Vcc.

Therefore, the second internal voltage IVC2 is stable and insensitive to noise caused by the fluctuation of the external voltage Vcc in comparison with the first internal voltage IVC1.

As a result, the internal voltage generating circuit of the first embodiment according to the present invention generates the first internal voltage IVC1 following the first reference voltage Vref1, generates the second reference voltage Vref2 using the first internal voltage IVC1, and generates the second internal voltage IVC2 following the second reference voltage Vref2, using the first internal voltage IVC1 as a power source, thereby supplying the second internal voltage IVC2 to a circuit requiring stabilized internal voltage. Therefore, it is possible to provide reliability for the normal operation of the semiconductor device, thereby maximizing or increasing the lifetime of the semiconductor device.

Figure 9:
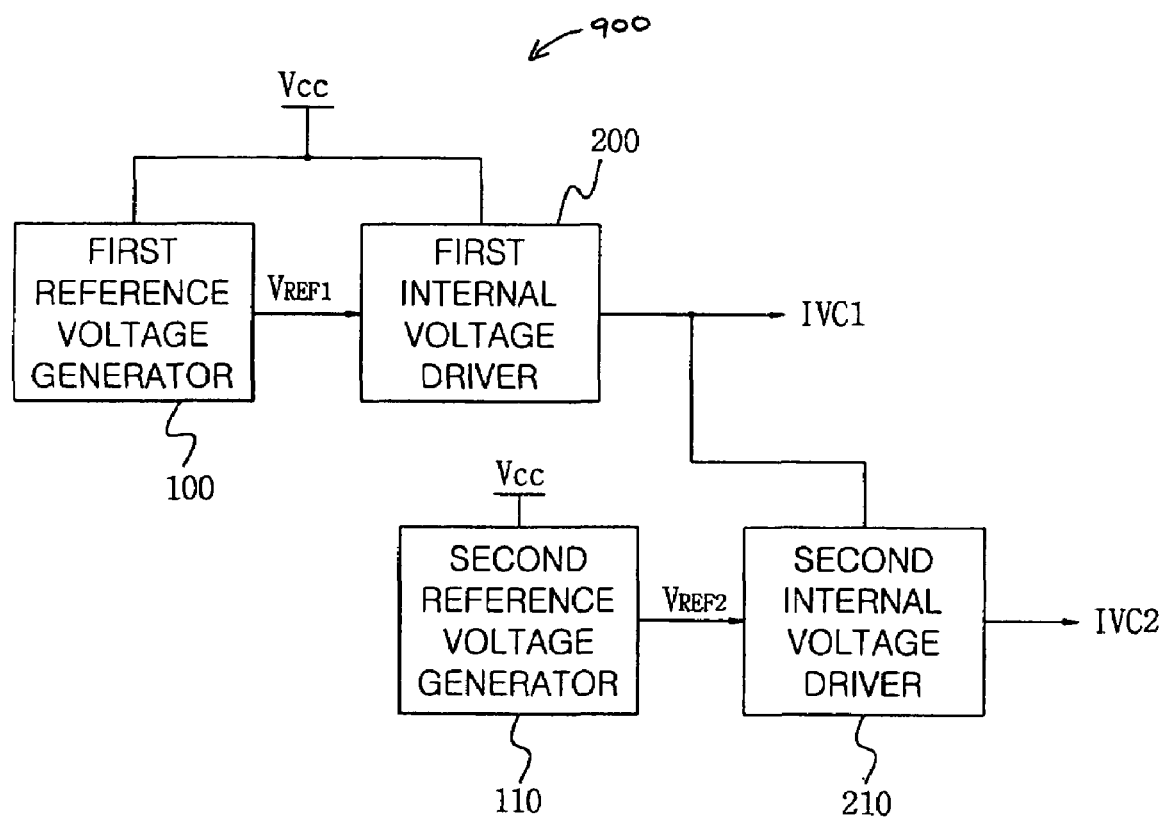
FIG. 9 is a schematic block diagram illustrating an internal voltage generating circuit according to a second embodiment of the present invention.

FIG. 9 is a schematic block diagram illustrating an internal voltage generating circuit, indicated generally by the reference numeral 900, according to a second embodiment of the present invention.

Referring to FIG. 9, the internal voltage generating circuit according to a second embodiment of the present invention comprises a first reference voltage generator 100 for generating a first reference voltage Vref1 using an external voltage Vcc, a first internal voltage driving portion 200 for receiving the external voltage Vcc as a power source to generate a first internal voltage IVC1 following the first reference voltage Vref1, a second reference voltage generator 110 for generating a second reference voltage Vref2 using the external voltage Vcc, and a second internal voltage driving portion 210 for receiving the first internal voltage IVC1 as a power source to output a second internal voltage IVC2 following the second reference voltage Vref2.

In the internal voltage generating circuit, since the second internal voltage IVC2 uses the first internal voltage IVC1 as the power source and follows the second reference voltage Vref2, it is output to be insensitive to noise caused by the external voltage Vcc. Then, the second reference voltage Vref2 may be more affected by the external voltage Vcc than the first reference voltage Vref1 according to the first embodiment. However, the second internal voltage IVC2 is satisfied for a circuit that requires output voltage equal to the level of the first internal voltage IVC1 and more stabilized internal voltage insensitive to the fluctuation of the external voltage Vcc.

Figure 10:
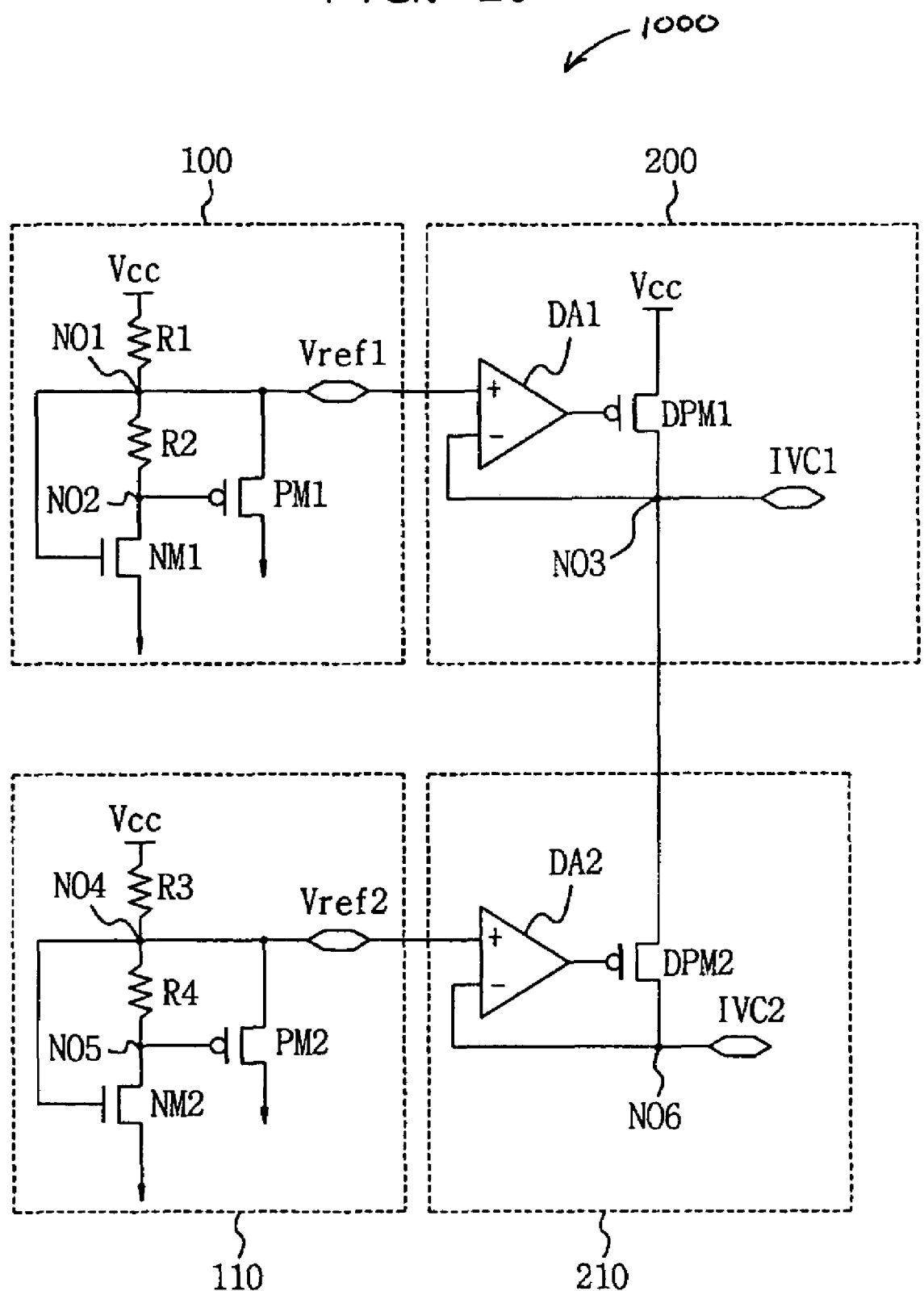
FIG. 10 is a detailed diagram illustrating the internal voltage generating circuit of FIG. 9.

FIG. 10 is a detailed diagram illustrating the internal voltage generating circuit of FIG. 9, and indicated generally by the reference numeral 1000. Referring to FIG. 10, a first reference voltage generator 100 comprises resistors R1 and R2, and N-type CMOS transistor NM1, which are arranged in series between the external voltage Vcc and the ground voltage Vss. The gate of N-type CMOS transistor NM1 is connected to a node NO1 between the resistor R1 and the resistor R2, and then the first reference voltage Vref1 is generated from the node NO1. The P-type CMOS transistor PM1 is coupled between the node NO1 and the ground voltage Vss, in which a gate is connected to the drain node NO2 of the N-type CMOS transistor NM1. When the external voltage Vcc increases to the extent that it turns on the N-type CMOS transistor NM1, the electrical potential of the drain node NO2 is lowered because of current flow into the ground voltage Vss via the channel of the N-type CMOS transistor NM1. Then, the P-type CMOS transistor PM1 is turned on, and the potential of the first reference voltage Vref1 at the node NO1 is lowered until voltage pull-down path via the P-type CMOS transistor PM1 is cut off. On the contrary, in the case that the potential of the external voltage Vcc is low, the first reference voltage Vref1 is pulled up through the resistor R1, because turn-on resistance of the N-type CMOS transistor NM1 increases. That is, the first reference voltage Vref1 is generated in the potential of low level if the external voltage Vcc is high, and the first reference voltage Vref1 is generated in the potential of high level if the external voltage Vcc is low. Then, the first reference voltage Vref1 having a certain average level is output through the node NO1.

Also, a first comparator DA1 of the first internal voltage driving portion 200 compares the first reference voltage Vref1 generated from the first reference voltage generator 100 with the first internal voltage IVC1 fed back from the node NO3, to output the comparison signal. Then, the comparison signal of low level is output when the first reference voltage Vref1 is higher than the first internal voltage IVC1, and the comparison signal of high level is output when the first reference voltage Vref1 is lower than the first internal voltage IVC1. A first driving P-type CMOS transistor DPM1 supplies or cuts off the external voltage Vcc responding to the comparison signal. Therefore, the first internal voltage driving portion 200 compares the first reference voltage Vref1 with the first internal voltage IVC1 fed back to decrease the output voltage when the first internal voltage IVC1 is higher than the first reference voltage Vref1, and to increase the output voltage when the first internal voltage IVC1 is lower than the first reference voltage Vref1, thereby outputting the first internal voltage IVC1 following the first reference voltage Vref1. Then, in the case that the external voltage Vcc is fluctuated, since the first internal voltage IVC1 is changed slightly according to the fluctuation of the external voltage, the first internal voltage IVC1 is output via a node NO3, and supplied to a second internal voltage driving portion 210.

The second reference voltage generator 110 receives the external voltage Vcc and generates the second reference voltage Vref2 from a node NO4 coupled between a resistor R3 and a resistor R4, which are arranged in series with an N-type CMOS transistor NM2. Between the external voltage Vcc and the ground voltage Vss, the gate of the N-type CMOS transistor NM2 is connected to the node NO4 between the resistor R3 and the resistor R4. The operation of the second reference-generating portion 110 is the same as that of the first reference voltage generator 100. Thus, its description is omitted. The second reference voltage Vref2 is then supplied to the second internal voltage-driving portion 210 via the node NO4.

A second comparator DA2 of the second internal voltage driving portion 210 receives the second reference voltage Vref2 generated from the second reference voltage generator 110, compares the second reference voltage Vref2 with the second internal voltage IVC2 fed back and outputs a resultant comparison signal. Then, the comparison signal of high level is output to a second driving P-type CMOS transistor DPM2 when the second internal voltage IVC2 is higher than the second reference voltage Vref2, and the comparison signal of low level is output to the second driving P-type CMOS transistor DPM2 when the second internal voltage IVC2 is lower than the second reference voltage Vref2. And then, the second driving P-type CMOS transistor DPM2 supplies or cuts off the first internal voltage IVC1 responding to the comparison signal. Therefore, the second internal voltage driving portion 210 receives the first internal voltage IVC1 as a power source, and compares the second reference voltage Vref2 with the second internal voltage IVC2 fed back thereby outputting the second internal voltage IVC2 following the second reference voltage Vref2.

Therefore, the second internal voltage-driving portion 210 receives the first internal voltage IVC1 as a power source, and produces the second internal voltage IVC2 that has a considerably reduced variation gradient in comparison with that of the first internal voltage IVC1. And the second internal voltage IVC2 has a constant and stable voltage level compared with the first internal voltage IVC1, which is affected by the fluctuation of the external voltage Vcc. That is, although the second reference voltage Vref2 may be affected by the fluctuation of the external voltage Vcc, it can be obtained the second internal voltage IVC2 which has more stable voltage than the first internal voltage IVC1 because the first internal voltage IVC1 is more stable than the external voltage Vcc. Further, although the second internal voltage IVC2 may have a characteristic proportional to the first internal voltage IVC1, yet the second internal voltage IVC2 is insensitive to noise of the external voltage in comparison with the first internal voltage IVC1.

The above-mentioned circuit, which uses the first internal voltage IVC1 and the second internal voltage IVC2, can be preferably used to apply the internal voltages to a circuit requiring stabilized internal voltage.

Figure 11A:
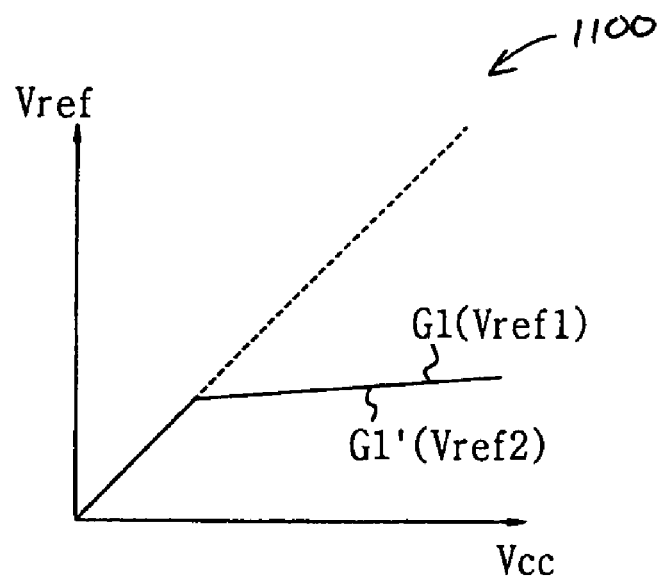
FIGS. 11a and 11b are graphs, each of which compares initial operating characteristics of the first and the second reference voltages according to the second embodiment of FIGS. 9 and 10.
Figure 11B:
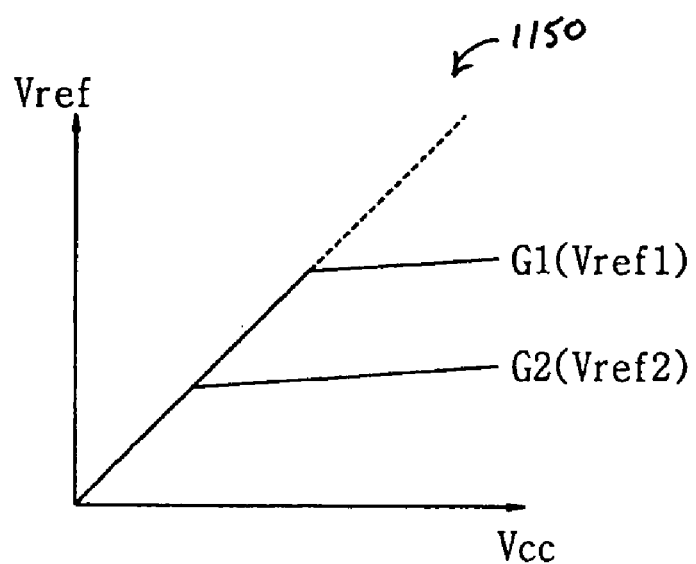

FIGS. 11a and 11b are graphs, each of which compares initial operating characteristics of the first and the second reference voltages according to the second embodiment of the present invention. In FIGS. 11a and 11b, the horizontal axis represents the external voltage Vcc while the longitudinal axis represents the reference voltage Vref.

Referring to FIG. 11a for the graph indicated generally by the reference numeral 1100, in the case that the first and second reference voltages Vref1 and Vref2 have the same levels, the first and second reference voltages Vref1 and Vref2 increase according as the external voltage Vcc increases if the external voltage Vcc is lower than initial setting voltage, and the first and second reference voltages converge into a certain voltage independent of the external voltage Vcc if the external voltage Vcc is higher than the setting voltage. Then, the graphs G1 and G2 of the first and second reference voltages Vref1 and Vref2 have a similar variation gradient as induced by the external voltage Vcc.

Referring to FIG. 11b for the graph indicated generally by the reference numeral 1150, in the case that the first reference voltage Vref1 has a level higher than that of the second reference voltage Vref2, the first and second reference voltages Vref1 and Vref2 increase according as the external voltage Vcc increases if the external voltage Vcc is low, and the first reference voltage Vref1 converges into a certain voltage after the second reference voltage Vref2 converges into a setting voltage. Then, the graph G1 of the first reference voltage Vref1 has a variation gradient very similar to the graph G2 of the second reference voltage Vref2.

Figure 12A:
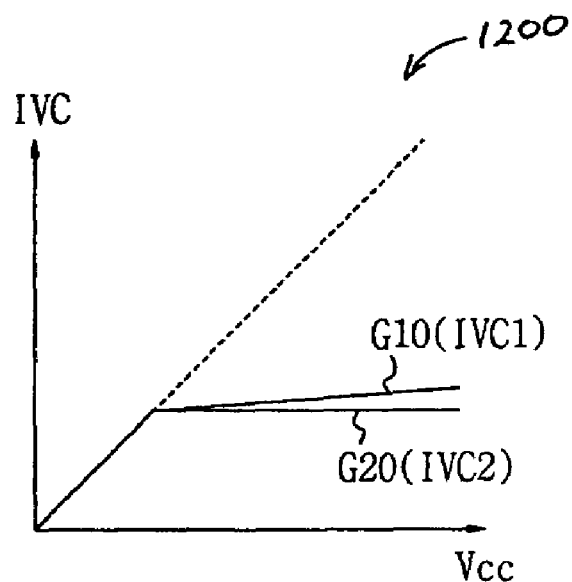
FIGS. 12a and 12b are graphs, each of which compares initial operating characteristics of the first and the second internal voltages according to the second embodiment of FIGS. 9 and 10.
Figure 12B:
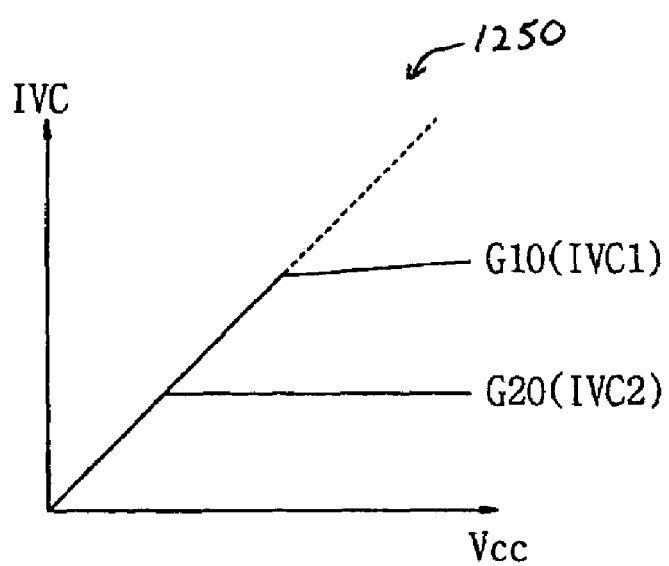

FIGS. 12a and 12b are graphs, each of which compares initial operating characteristics of the first and the second internal voltages according to the second embodiment of the present invention. In FIGS. 12a and 12b, the horizontal axis represents the external voltage Vcc while the longitudinal axis represents the internal voltage IVC.

Referring to FIG. 12a for the graph indicated generally by the reference numeral 1200, in the case that the first and second internal voltages IVC1 and IVC2 have the same levels, the first and second internal voltages IVC1 and IVC2 move according to the external voltage Vcc if the external voltage Vcc is lower than setting voltage, and the first and second internal voltages IVC1 and IVC2 converge into similar level if the external voltage Vcc is higher than the setting voltage. The first internal voltage IVC1 converges as described above, while the graph G10 of the first internal voltage IVC1 has a variation gradient greater than that on the graph G20 of the second internal voltage IVC2. This appearance can be caused as the first internal voltage IVC1 has more stable level than the external voltage Vcc.

Referring to FIG. 12b for the graph indicated generally by the reference numeral 1250, in the case that the first internal voltage IVC1 has a level higher than that of the second internal voltage IVC2, the first and second internal voltages IVC1 and IVC2 increase according as the external voltage Vcc increases if the external voltage Vcc is low, and the first internal voltage IVC1 converges into a certain voltage after the second internal voltage IVC2 converges into a setting voltage. Then, like the preceding, the graph G20 of the second internal voltage IVC2 has a variation gradient less than that on the graph G10 of the first internal voltage IVC1.

Therefore, even though the first and second internal voltages IVC1 and IVC2 have the same levels or different levels, the graph G20 of the second internal voltage IVC2 has a variation gradient less than that on the graph G10 of the first internal voltage IVC1.

Figure 13A:
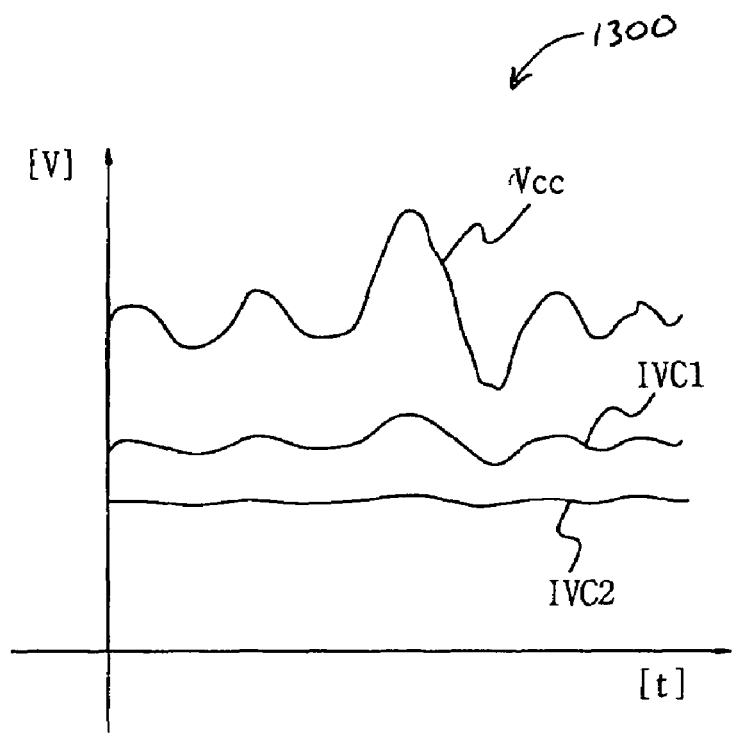
FIGS. 13a and 13b are graphs, each of which illustrates output voltages of the internal voltage generating circuit according to the second embodiment of FIGS. 9 and 10.
Figure 13B:
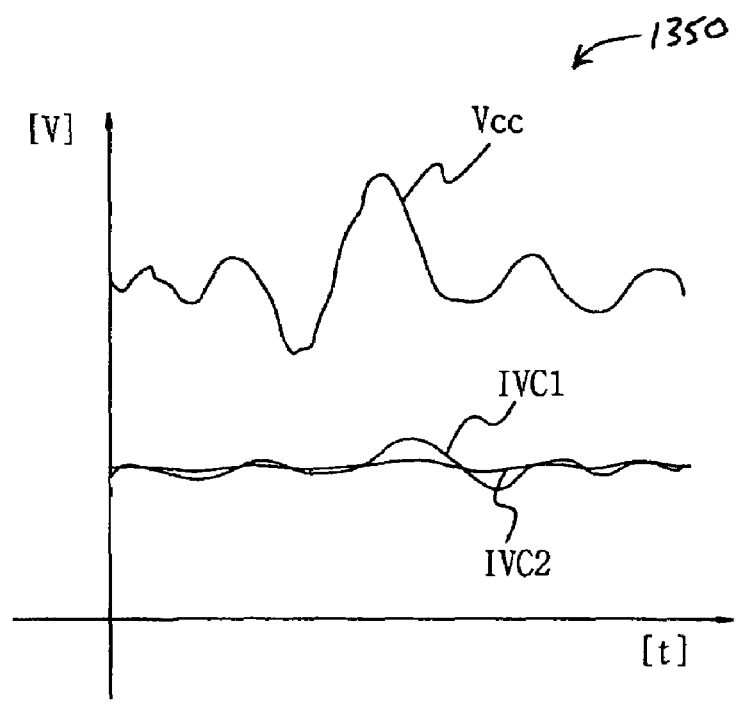

FIGS. 13a and 13b are graphs, each of which illustrates output voltages of the internal voltage generating circuit according to the second embodiment of the present invention. Referring to FIG. 13a for the graph indicated generally by the reference numeral 1300, in the case that the external voltage Vcc is fluctuated in the internal voltage generating circuit according to the second embodiment of the present invention, since the second internal voltage IVC2 has a fluctuation less than that of the first internal voltage IVC1, the second internal voltage IVC2 is output as more constant and stable voltage level compared with the first internal voltage IVC1. The detailed description thereof was already described in connection with the first embodiment, whereby we will omit it. Likewise, referring to FIG. 13b for the graph indicated generally by the reference numeral 1350, the detailed description thereof was already described in con nection with the first embodiment, and is therefore omitted here for brevity.

As a result, the internal voltage generating circuit of the second embodiment according to the present invention generates the first internal voltage IVC1 following the first reference voltage Vref1, generates the second reference voltage Vref2 using the external voltage Vcc, and generates the second internal voltage IVC2 following the second reference voltage Vref2, using the first internal voltage IVC1 as a power source, thereby supplying the second internal voltage IVC2 to a circuit requiring stabilized internal voltage. Therefore, it is possible to provide reliability for the normal operation of the semiconductor device, thereby maximizing or increasing the lifetime of the semiconductor device.

Figure 14:
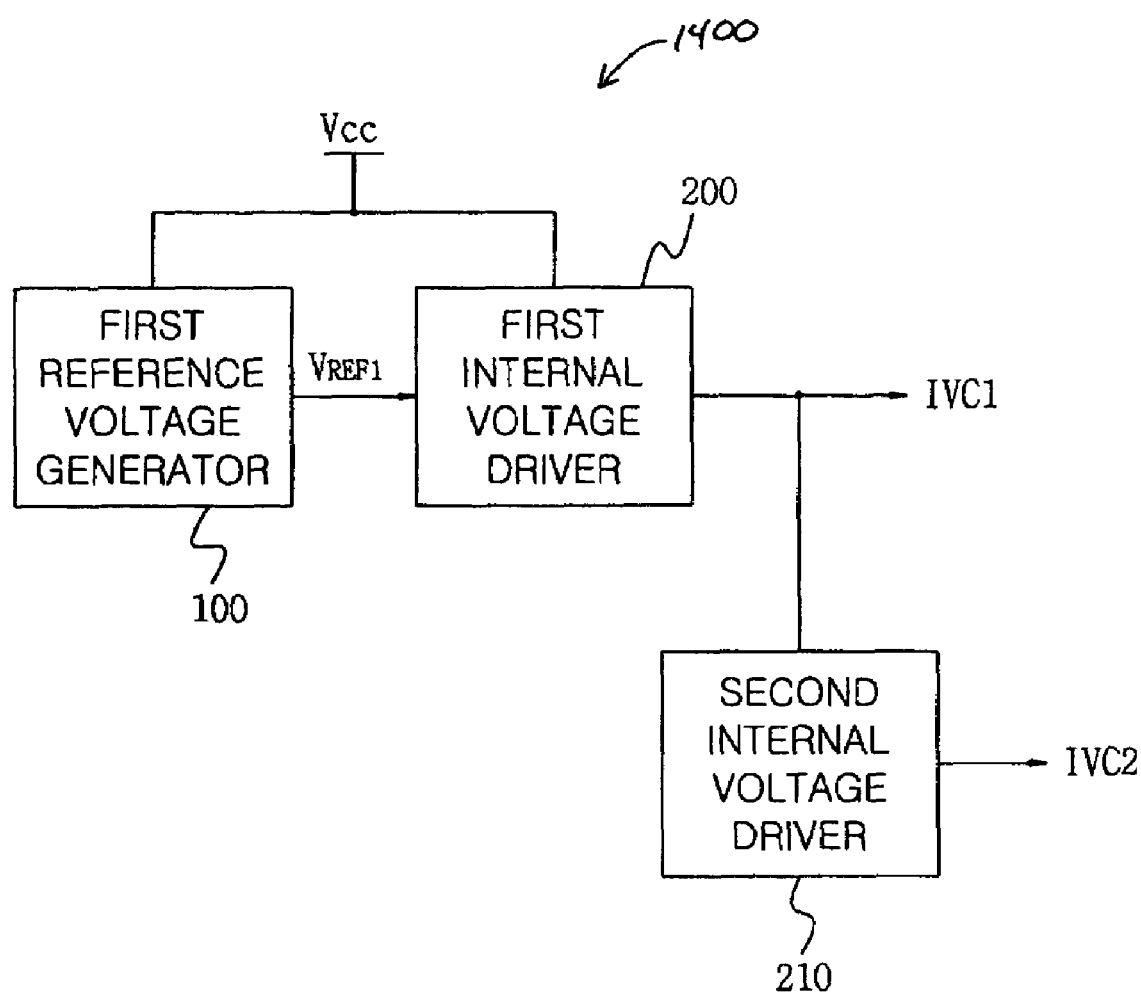
FIG. 14 is a schematic block diagram illustrating an internal voltage generating circuit and a pumping voltage generating circuit according to a third embodiment of the present invention.

FIG. 14 is a schematic block diagram illustrating the internal voltage generating circuit according to a third embodiment of the present invention, and indicated generally by the reference numeral 1400.

Referring to FIG. 14, the internal voltage generating circuit comprises a first reference voltage generator 100 for generating a first reference voltage Vref1 using an external voltage Vcc, a first internal voltage driving portion 200 for receiving the external voltage Vcc as a power source to generate a first internal voltage IVC1 following the first reference voltage Vref1, and a second internal voltage driving portion 210 for receiving the first internal voltage IVC1 to generate a second internal voltage IVC2. Here, the second internal voltage IVC2 is a pumping voltage Vpp, which has a voltage level higher than that of the first internal voltage IVC1.

Therefore, the internal voltage generating circuit according to a third embodiment of the present invention generates a more stable pumping voltage Vpp insensitive to a fluctuation of the external voltage, in comparison with an ordinary pumping voltage Vpp which is produced by receiving the external voltage, while the internal voltage generating circuit receives the first internal voltage IVC1 as a power source to generate the pumping voltage Vpp. Generally, the pumping voltage Vpp in a semiconductor device is well known in the prior art, which generates a voltage greater than an external voltage by means of pumping device and which is used for an word line driving portion and the like. Thus, the detailed description thereof is omitted.

As having been described in the foregoing, since the internal voltage generating circuit according to the present invention generates the internal voltage which is insensitive to noise caused by the external voltage and supplies the internal voltage to a circuit requiring a stabilized power source, it is possible to provide reliability for the normal operation of the semiconductor device, thereby maximizing the lifetime of the semiconductor device.

What is claimed is:

1. An internal voltage generating circuit adapted to a semiconductor device, the internal voltage generating circuit comprising:
   a first reference voltage generator for generating a first reference voltage using an external voltage;
   a first internal voltage-driving portion for comparing the first reference voltage with a first internal voltage fed back to generate the first internal voltage following the first reference voltage;
   a second reference voltage generator for receiving the first internal voltage to generate a second reference voltage which is more insensitive to fluctuation of the external voltage than the first reference voltage; and
   a second internal voltage driving portion for receiving the first internal voltage as a power source and comparing the second reference voltage with a second internal voltage fed back to output the second internal voltage which follows the second reference voltage,
   wherein at least one of the first or second internal voltage-driving portions comprises a comparator and a driving transistor in signal communication with the comparator.

2. The internal voltage generating circuit as claimed in claim 1, wherein the first internal voltage-driving portion comprises:
   a first comparator for comparing the first reference voltage with the second internal voltage; and
   a first driving transistor for receiving the comparison signal from the first comparator to control the external voltage and output the first internal voltage.

3. The internal voltage generating circuit as claimed in claim 1, wherein the second internal voltage-driving portion comprises:
   a second comparator for comparing the second reference voltage with the second internal voltage; and
   a second driving transistor for receiving the comparison signal from the second comparator to control the first internal voltage and output the second internal voltage.

4. The internal voltage generating circuit as claimed in claim 1, wherein the second reference voltage has a variation gradient smaller than that of the first reference voltage.

5. The internal voltage generating circuit as claimed in claim 1, wherein the second internal voltage has a variation gradient smaller than that of the first internal voltage.

6. The internal voltage generating circuit as claimed in claim 1, wherein the second internal voltage has a level smaller than that of the first internal voltage.

7. The internal voltage generating circuit as claimed in claim 1, wherein the second internal voltage is insensitive and more stable than the first internal voltage to noise caused by fluctuation of the external voltage.

8. An internal voltage generating circuit adapted to a semiconductor device, the internal voltage generating circuit comprising:
   a first reference voltage generator for generating a first reference voltage using an external voltage;
   a first internal voltage-driving portion for comparing the first reference voltage with a first internal voltage fed back to generate the first internal voltage following the first reference voltage;
   a second reference voltage generator for generating a second reference voltage using the external voltage; and
   a second internal voltage-driving portion for receiving the first internal voltage as a power source and comparing the second reference voltage with a second internal voltage fed back to output the second internal voltage which follows the second reference voltage,
   wherein at least one of the first or second internal voltage-driving portions comprises a comparator and a driving transistor in signal communication with the comparator.

9. The internal voltage generating circuit as claimed in claim 8, wherein if the level of the first internal voltage is identical with that of the second internal voltage, the first reference voltage and the second reference voltage have the same variation gradient and coincide with each other.

10. The internal voltage generating circuit as claimed in claim 8, wherein if the level of the first internal voltage is different from that of the second internal voltage, the first reference voltage has a variation gradient which increases in proportion to the difference between the first reference voltage and the second reference voltage.

11. The internal voltage generating circuit claimed in claim 8, wherein the second internal voltage has a variation gradient smaller than that of the first internal voltage.

12. The internal voltage generating circuit as claimed in claim 8, wherein the second internal voltage is insensitive and more able than the first internal voltage to noise caused by fluctuation of the external voltage.

* * * * *